(12) United States Patent
Iyer et al.

(10) Patent No.: US 8,947,140 B2
(45) Date of Patent: Feb. 3, 2015

(54) CONTINUOUS ADAPTIVE TRAINING FOR DATA INTERFACE TIMING CALIBRATION

(71) Applicant: Uniquify, Inc., San Jose, CA (US)

(72) Inventors: Venkat Iyer, Sunnyvale, CA (US);
Prashant Joshi, Santa Clara, CA (US);
Jung Lee, Sunnyvale, CA (US)

(73) Assignee: Uniquify, Inc., Santa Clara, CA (US)

( * ) Notice: Subject to any disclaimer, the term of this patent is extended or adjusted under 35 U.S.C. 154(b) by 0 days.

(21) Appl. No.: 14/205,208

(22) Filed: Mar. 11, 2014

(65) Prior Publication Data

US 2014/0266347 A1   Sep. 18, 2014

Related U.S. Application Data

(60) Provisional application No. 61/777,648, filed on Mar. 12, 2013.

(51) Int. Cl.
*H03L 7/06* (2006.01)
*H03L 7/10* (2006.01)
(52) U.S. Cl.
CPC ........................................ *H03L 7/10* (2013.01)
USPC ............................................ 327/158; 327/161
(58) Field of Classification Search
None
See application file for complete search history.

(56) References Cited

U.S. PATENT DOCUMENTS

| | | | | |
|---|---|---|---|---|
| 6,434,081 | B1 * | 8/2002 | Johnson et al. | 365/233.14 |
| 7,042,296 | B2 * | 5/2006 | Hui et al. | 331/17 |
| 7,509,223 | B2 * | 3/2009 | Chong et al. | 702/107 |
| 2010/0271094 | A1 * | 10/2010 | Hassan | 327/161 |
| 2012/0187993 | A1 * | 7/2012 | Kanno et al. | 327/158 |
| 2013/0257497 | A1 * | 10/2013 | Thelen et al. | 327/158 |
| 2014/0181568 | A1 * | 6/2014 | Prakash et al. | 713/401 |

* cited by examiner

*Primary Examiner* — Cassandra Cox
(74) *Attorney, Agent, or Firm* — Cherskov Flaynik & Gurda

(57) ABSTRACT

Circuits and methods for implementing a continuously adaptive timing calibration training function in an integrated circuit interface are disclosed. A mission data path is established where a data bit is sampled by a strobe. A similar reference data path is established for calibration purposes only. At an initialization time both paths are calibrated and a delta value between them is established. During operation of the mission path, the calibration path continuously performs calibration operations to determine if its optimal delay has changed by more than a threshold value. If so, the new delay setting for the reference path is used to change the delay setting for the mission path after adjustment by the delta value. Circuits and methods are also disclosed for performing multiple parallel calibrations for the reference path to speed up the training process.

20 Claims, 8 Drawing Sheets

200 Initialization and Continuous Adaptive Training 202

Perform initial sweep calibrations for Mission DLL & Reference DLL:
Reference DLL → Start = $S_0Ref$, End = $E_0Ref$
Mission DLL → Start = $S_0Mis$, End = $E_0Mis$ Mission DLL calibrates to $M_0 = E_0Mis$
Reference DLL calibrates to $R_0 = E_0Ref$
DLL Delta ($\Delta$) = $M_0 - R_0$

↓

Initiate Mission path operation with Delay setting $M_0$. 204

↓

Calibrate the reference DLL again. The result of the new calibration of the reference DLL is $R_1$. 206

↓

208
Is ABS($R_1 - R_0$) <= $T_C$?
($T_C$ = Change Threshold)

Yes → (loop back to 206)

No ↓

ABS($R_1 - R_0$) > $T_C$, so set a new value for the mission DLL to be: $M_1 = M_0 + R_1 - R_0$ 210

↓

Update Mission DLL with new $M_1$ value at the next opportunity. 212

CONTINUOUS ADAPTIVE TRAINING FOR DATA INTERFACE TIMING CALIBRATION

CROSS REFERENCE TO RELATED APPLICATIONS

This application claims the benefit of U.S. Provisional Application No. 61/777,648 filed on Mar. 12, 2013, presently pending.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The present invention relates generally to interface circuits, typically implemented on integrated circuits such as Processor chips, memory controller chips, and SOC (System On Chip) integrated circuits where such interfaces are required. One common example of such an interface would receive data read from dynamic memory chips that are located externally to a device containing the receiving interface.

BACKGROUND

Given today's high clock rates and transmission line effects when signals must travel between integrated circuit chips, changes along signal paths can occur over time that affect signal timing. As a system heats and cools during operation, and/or develops hot and cool spots, the skew between data bits, or between data bits and strobe signals can likewise change as data bit signals and strobe signals travel off chip and between chips through various system-level paths. Therefore, it would be useful to have a way to perform dynamic timing calibration and re-calibration from time to time during system operation, and to do so quickly and dynamically without affecting the normal operation of the system.

One application where such a continuously adaptive calibration or training mechanism for data interface timing calibration is especially useful is to compensate for variable system-level delays in dynamic memory interfaces where DQ data bits can develop a skew problem with respect to the DQS strobe used to sample them, or where the optimal DQS strobe timing over all data bits varies during the functional operation of the system. Similarly, at the timing interface between the Phy and internal core clock domains in a dynamic memory based controller system, the timing relationship between an internal capture clock and data coming from the Phy can also drift due to system-level delays. In addition, jitter can develop between data bits and strobes, or between signals in different clock domains, and it would also be useful to resolve jitter issues while performing a continuous timing calibration function.

SUMMARY

Circuits and methods for implementing a continuously adaptive timing calibration training function in an integrated circuit interface are disclosed. A mission data path is established where a data bit is sampled by a strobe. A similar reference data path is established for calibration purposes only. At an initialization time both paths are calibrated and a delta value between them is established. During operation of the mission path, the calibration path continuously performs calibration operations to determine if its optimal delay has changed by more than a threshold value. If so, the new delay setting for the reference path is used to change the delay setting for the mission path after adjustment by the delta value. Since the determination of calibration is performed solely on the reference path, and the transfer of delay parameters to the mission path is almost instantaneous, signal traffic on the mission path is not interrupted in order for even frequent re-calibrations to be performed.

Circuits and methods are also disclosed for performing multiple parallel calibrations for the reference path to speed up the training process. Where multiple parallel calibrations are implemented, the continuous adaptive training function according to the invention enables a mission data path to be recalibrated more frequently in applications where delays may change rapidly during system operation.

According to different embodiments of the invention, the principles described herein can be utilized to adjust any timing relationship where one signal is used to sample another signal. The signal being sampled may be programmably delayed according to the invention, or a strobe signal used for sampling may instead be programmably delayed. At times, jitter may be evident on either a strobe signal or a signal being sampled by the strobe signal, and circuits and methods are included for providing minimum numbers of delay increments for delay measurements such that false measurements due to jitter are avoided during a calibration process. During the design process for circuits described herein, efforts are made to equalize the timing relationship between mission and reference data paths such that any timing delta between them is minimized.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention will be apparent from the following detailed description taken in conjunction with the accompanying drawings.

FIG. 2 shows an exemplary overall flowchart for continuous adaptive training according to the invention.

DETAILED DESCRIPTION

Figure 1:
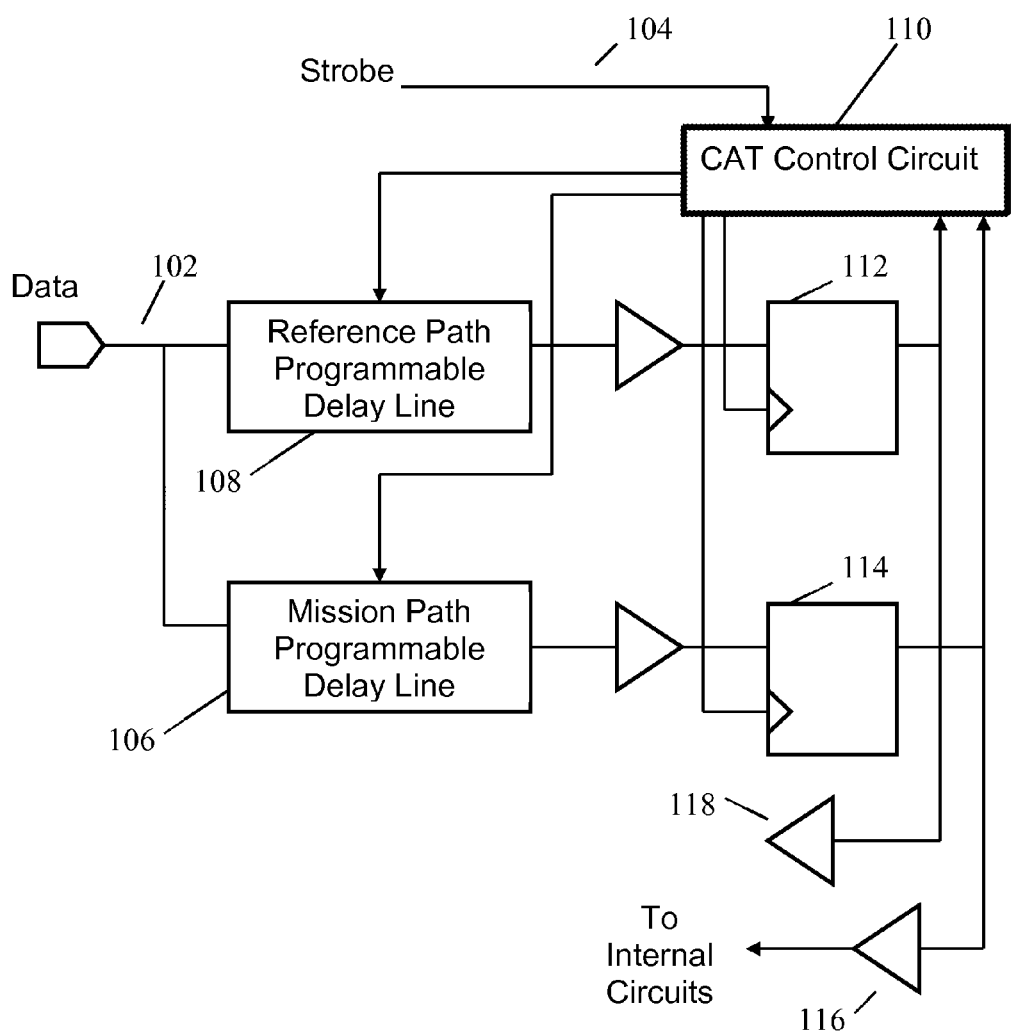
FIG. 1 shows exemplary and non-limiting embodiments for generalized circuit descriptions describing different aspects of the invention.

The embodiments disclosed by the invention are only examples of the many possible advantageous uses and implementations of the innovative teachings presented herein. In general, statements made in the specification of the present application do not necessarily limit any of the various claimed inventions. Moreover, some statements may apply to some inventive features but not to others. In general, unless otherwise indicated, singular elements may be in plural and vice versa with no loss of generality. In the drawings, like numerals refer to like parts through several views.

Circuits and methods for implementing a continuously adaptive timing calibration training function in an integrated circuit interface are disclosed. A mission data path is established where a data bit is sampled by a strobe. A similar reference data path is established for calibration purposes only. At an initialization time both paths are calibrated and a delta value between them is established. During operation of the mission path, the calibration path continuously performs calibration operations to determine if its optimal delay has changed by more than a threshold value. If so, the new delay setting for the reference path is used to change the delay setting for the mission path after adjustment by the delta value. Circuits and methods are also disclosed for performing multiple parallel calibrations for the reference path to speed up the training process.

Timing calibration according to the invention is able to be run dynamically and continuously without interrupting the operation of the functional circuit that is occasionally re-calibrated. Re-calibration is performed in nanoseconds and for most system configurations—especially those including memory system interfaces—there are always opportunities to perform an instantaneous transfer of delay line (DLL) settings without affecting proper operation. For example, it is usually acceptable to transfer delay parameters during a memory write cycle to a timing circuit supporting memory read operations. A full re-initializing of both reference and mission paths takes longer but is still fast enough to run during longer periods such as during memory refresh operations.

For the exemplary and non-limiting examples described herein for different embodiments of the invention, and in view of the fact that many common applications for the invention include dynamic memory controllers and data interfaces receiving data bits and strobes from dynamic memories, reference will occasionally be made to "DQ" for data bits being sampled and bit leveled, and to "DQS" as the corresponding sampling strobe. It should be understood however that the circuits and methods described herein are applicable to any data interface receiving data bits and data strobes where skew and/or jitter develops over time, and it is desirable to mitigate these problems in order to produce more reliable data interface implementations.

FIG. 1 shows a generalized implementation for one exemplary and non-limiting embodiment of the invention. Here a data signal 102 is sampled by a strobe signal 104. In this example data signal 102 feeds two delay line (DLL) paths—a mission path 106 and a reference path 108. The outputs of these delay lines are sampled in flip-flops 112 and 114 respectively, and the outputs of these flip-flops are available to CAT (Continuous Adaptive Training) control circuit 110 as well as other internal circuits by way of buffer 116. Note that in an effort to equalize delays between reference and mission paths, occasionally buffers and other circuits will be added or altered as well known in the art in order to equalize loading and propagation delays. In this case, note that buffer 118 has been added as a load on the output of flip-flop 112 even though it is not necessary since the output of flip-flop 112 only drives CAT control circuit 110. Note that while the circuit diagram of FIG. 1 shows data bit 102 being delayed through the reference and mission paths, and alternate implementation of a similar function can be constructed according to the invention by delaying strobe signal 104 through separate reference and mission data path DLLs, and utilizing the resultant delayed strobes to sample data bit 102.

Figure 3:
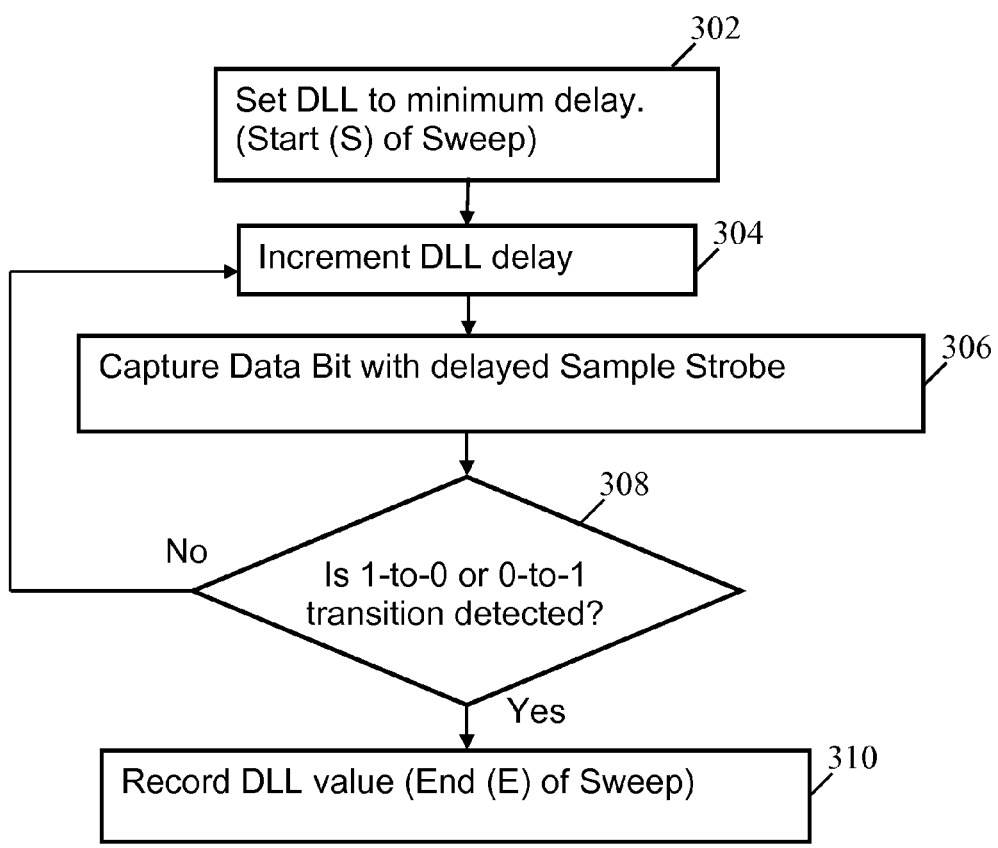
FIG. 3 shows an exemplary flowchart for calibration sweeps during continuous adaptive training calibration according to the invention.

FIG. 2 shows a flowchart 200 describing the function of a circuit constructed according to an exemplary embodiment of the invention. In step 202, initial calibrations are performed for both the mission DLL in the mission data path and the reference DLL in the reference data path. Since the initial calibration requires a calibration operation on the mission data path, this is one operation where traffic on the mission data path is interrupted, and is therefore best performed during an initial power-on calibration of a system containing the invention, or alternately performed during time periods such as memory refresh operations where the mission data path is not utilized for a duration wherein such an initial calibration can be performed. According to step 202, during initialization a sweep is performed on each data path whereby data is captured at each increment of delay line delay from a starting point until an endpoint is reached. For each sweep, a detection condition is reached during the sweep that indicates the sweep process should terminate. For many implementations, such a condition is detecting a transition on the data bit value being sampled. Such transition could be a 0-to-1 transition or alternatively a 1-to-0 transition depending upon the application. Initial calibration of the reference data path is shown as delay setting $R_0$. Specific details of performing such a calibration sweep are shown in FIG. 3. At the completion of the initial calibration per step 202, a DLL Delta ($\Delta$) value has been established that is equal to the value $(M_0-R_0)$.

In step 204, function of the mission path is initiated according to normal system operation utilizing delay setting $M_0$. The reference data path is again calibrated and a new delay setting for the reference DLL is determined to be $R_1$. Note that subsequent recalibration of the reference path has no effect on normal system operation utilizing the mission data path. In step 208 the absolute value of $(R_1-R_0)$ is computed and compared with a change threshold value $(T_C)$. If the absolute value of $(R_1-R_0)$ is less than $T_C$, then it is determined that any drift in system timing since the previous calibration is small enough that no adjustment to the calibration of the mission path is necessary. If on the other hand, the absolute value of $(R_1-R_0)$ is greater than $T_C$, then per step 210, a new DLL delay setting value $M_1$ is computed, and then per step 212 is applied to the mission path. The new DLL delay setting value for the mission path is $M_1=(M_0+R_1-R_0)$.

FIG. 3 shows a flowchart 300 describing a calibration sweep for either the reference DLL or the mission DLL. Per step 302 the DLL being calibrated is set for example to a minimum delay as the starting point for the sweep. Per step 304 the DLL delay is incremented and then the sampled data bit is captured 306 by a delayed sample strobe (for an exemplary implementation where the sample strobe is delayed by the reference and mission DLLs). Note that in an alternate embodiment the captured data bit may be delayed instead of delaying the sample strobe. In step 308 a transition on the captured data bit is detected which may be either a 0-to-1 transition or alternately a 1-to-0 transition. If per step 308 no transition is detected the flow returns to step 304 where the DLL is incremented again. When a transition is detected, the flow proceeds to step 310 where the DLL value is recorded and the sweep ends.

Figure 4:
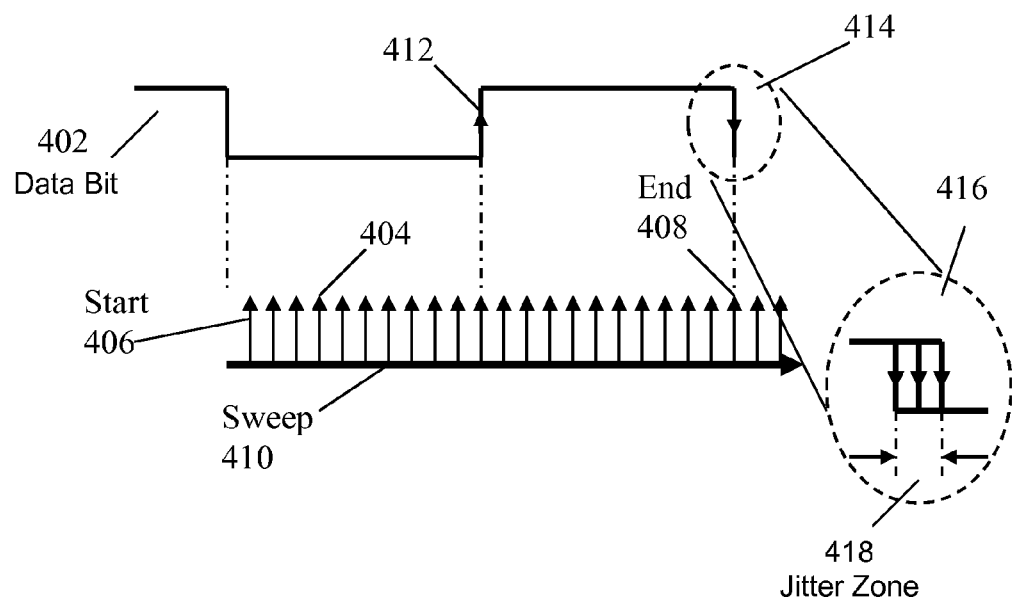
FIG. 4 shows an exemplary timing diagram in accordance with the flowchart of FIG. 3 including provision for jitter detection and avoidance.

A timing diagram 400 for the process of FIG. 3 is shown in FIG. 4. Here data bit 402 is sampled by a strobe 404 which is swept 410 from starting delay 406 until end delay 408 is reached upon detection of falling edge 414 of data bit 402. In some applications the transition causing the end of the sweep may instead be rising edge 412. When a strobe samples a data bit at either transition of the data bit, any jitter 416 occurring on either the strobe or the data bit may cause an incorrect determination of the condition for ending the sweep. For instance in the diagram of FIG. 4, if there is jitter on rising edge 412 it could be possible for a falling edge transition to be detected as part of that jitter whereas the true falling edge which ends the sweep is falling edge 414. As such, to avoid making an incorrect determination when a jitter zone 418 is encountered, the invention includes the requirement for any detected transitions to be separated from other detected transitions by at least a jitter threshold margin of delay. Such a jitter threshold margin may be set to any number of DLL delay increments according to the requirements of a specific application.

One application for the invention includes timing calibration for a DRAM controller circuit as described in U.S. Pat. No. 7,975,164. As described in circuit diagram 500 of FIG. 5, that patent describes a controller circuit that includes a function 502 entitled Self-configuring Logic which enables signals to be transferred from the Phy to the core clock domain of a circuit receiving data from a DDRAM. One application for a CAT function according to the invention is calibration of the delay for DLL 504 controlling the Capture_Clk signal. Another application for a CAT function according to the invention is calibration of the delay for DLL 506 which delays the DQS strobe in the Phy.

Figure 5:
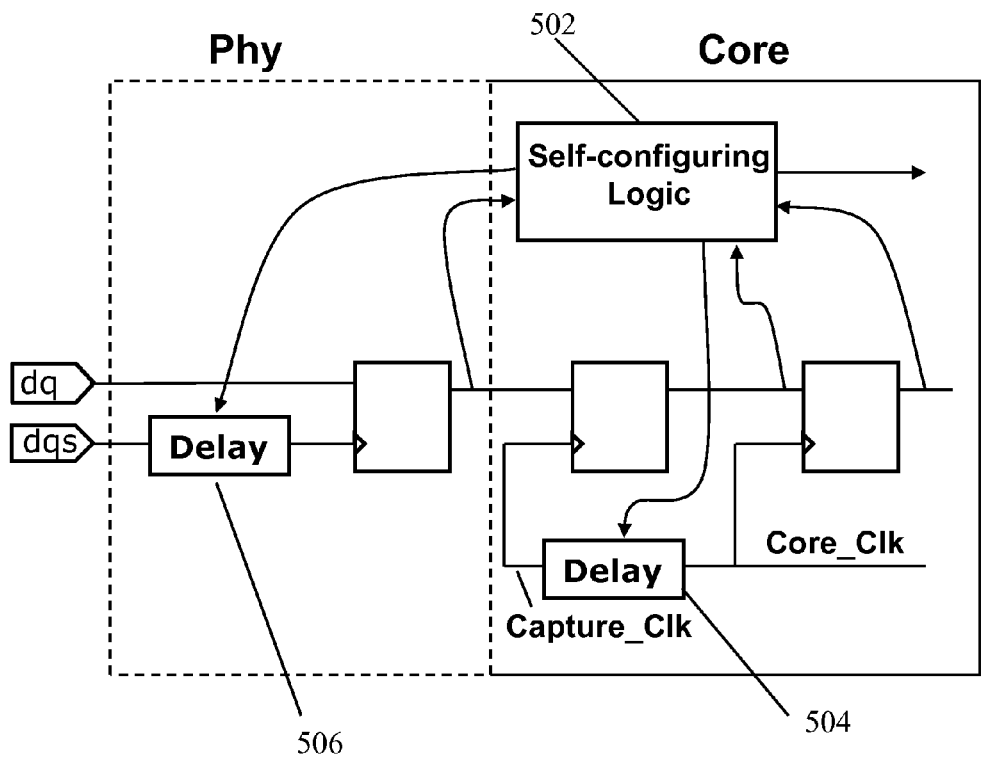
FIG. 5 shows a circuit diagram for a system implementation that incorporates an SCL (Self-Configuring Logic) circuit implementation as described in U.S. Pat. No. 7,975,164, and indicating timing areas where a continuous adaptive training functionality according to the invention may be applied.
Figure 6:
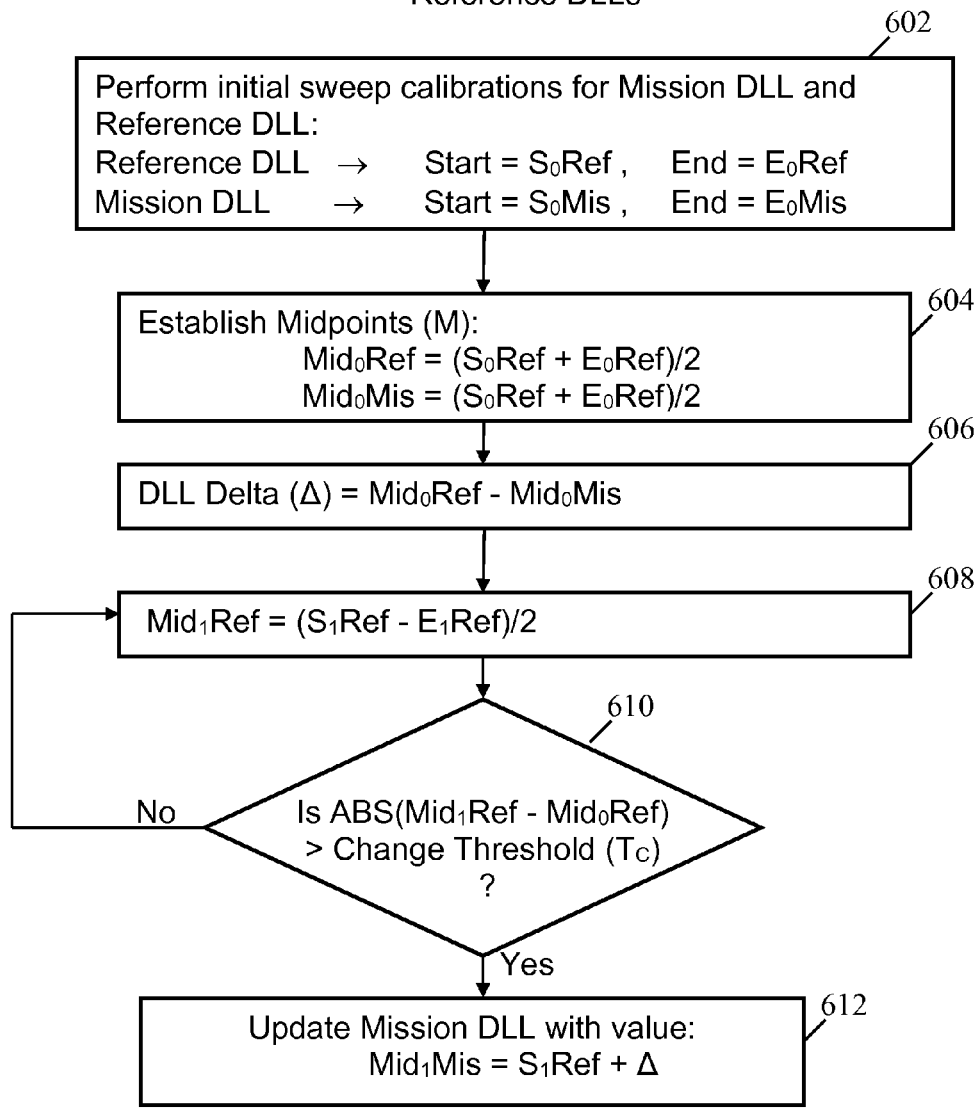
FIG. 6 shows an exemplary flowchart for an embodiment of the invention when applied to the SCL application of FIG. 5.

Flowchart 600 of FIG. 6 describes the process for calibration of the delay for DLL 504 controlling the Capture_Clk signal in the circuit of FIG. 5. In step 602 initial sweep calibrations are performed for a mission DLL and a reference DLL where start and end points are determined. For the specific application described with respect to FIG. 5, a midpoint of each calibration sweep is utilized as a timing calibration delay value as opposed to the endpoint of a sweep. As such, per step 604 midpoints are established for calibration sweeps of both reference and mission paths. In step 606 a Delta ($\Delta$) value is established between the midpoint delay of the reference data path and the midpoint delay of the mission data path. During functional operation of the mission path, per step 608 a new midpoint delay value is established for the reference data path without disturbing operation of the mission data path. The new midpoint delay value $Mid_1Ref$ is compared 610 with the previous midpoint delay value ($Mid_0Ref$) for the reference path, and if the absolute value of the difference between them is greater than a change threshold value (Tc), then the mission DLL is updated with new value $Mid_1Mis$ at the next opportunity, and again without disturbing functional operation of the mission data path. As shown with respect to step 612, any new value for the mission DLL data path is adjusted with respect to a revised reference DLL value by the Delta ($\Delta$) value between them established during the initial calibration of step 602. Note that the application described with respect to FIGS. 5 and 6 is exemplary of many other applications where the delay value corresponding to the end point of a calibration sweep is not chosen as the delay timing value for the mission path. Any timing value may be determined for implementation in the mission path based on transitions detected during a delay calibration sweep, and based on delays corresponding to those transitions an optimal timing delay can be determined for a specific application. To describe one exemplary and non-limiting scenario, a falling edge transition may be detected followed by the detection of a rising edge, and then an optimal timing calibration point is calculated to be half-way between the two detected transitions.

In some system applications, delays may change frequently as high-speed signals pass through multiple devices and/or across expanses of circuit board transmission lines, and to ensure reliable system operation it may be desirable to frequently recalibrate certain timing functions. For such applications an exemplary and non-limiting solution is described in circuit diagram 700 of FIG. 7 where a plurality of delay lines are utilized in parallel to speed up calibration of the reference path of a CAT function according to the invention. Here, data bit 702 is shown driving a plurality of delay lines 708-714 with the results being captured in flip-flop's according to a strobe signal 704 and controlled by CAT control circuit 706. Note that in an alternate embodiment, the strobe signal 704 could be delayed in a plurality of delay lines instead of delaying data bit 702. Each of delay lines 708-714 is responsible for analyzing only a portion of a calibration sweep with delay line 708 handling a first portion and delay line 714 handling the last portion. Delay lines 710 and 712 handle intermediate portions of the sweep. Note that physical portions of delay lines 708, 710, and 712 have been grayed-out, and marked as 716, 718 and 720 respectively. The grayed-out areas indicate physical portions of a delay line which need not be implemented since those delay increments are not required during operation and can therefore be depopulated. Only the portions of a delay line shown as not grayed out are utilized due to the fact that each delay line is only responsible for a portion of a calibration sweep.

Figure 7:
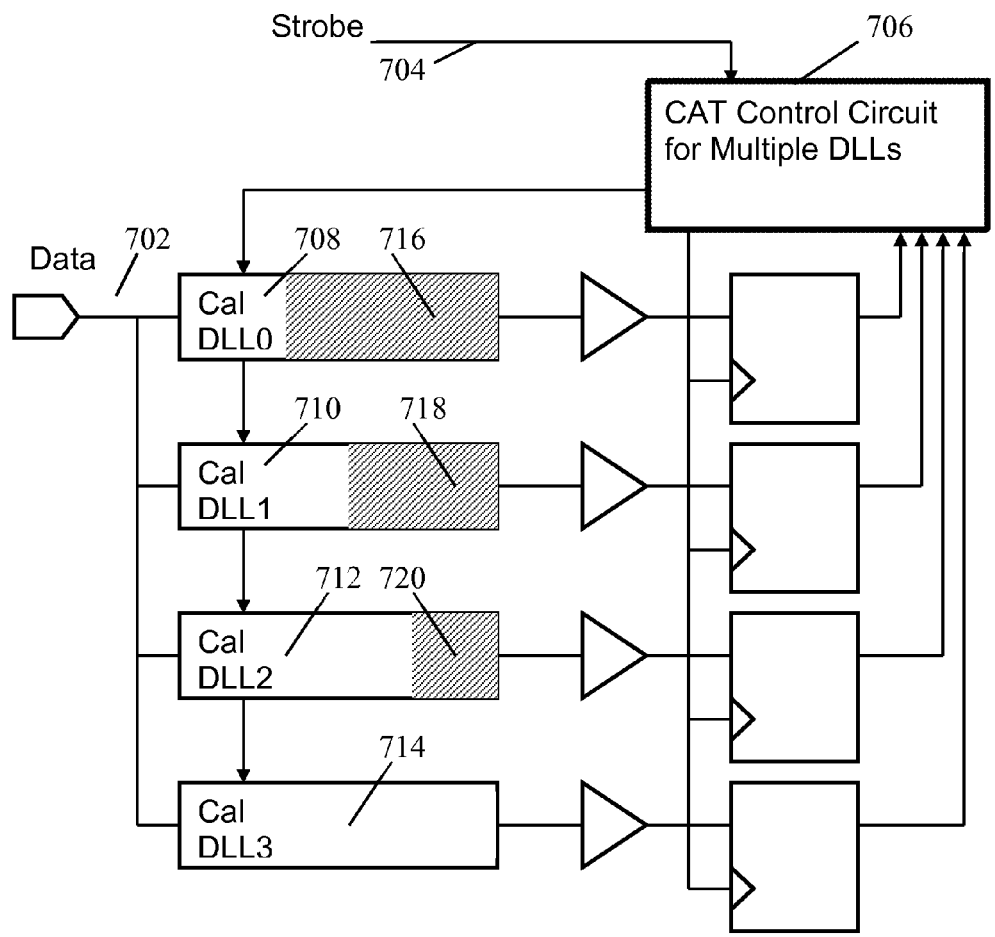
FIG. 7 shows an exemplary and non-limiting embodiment for an implementation of the invention where a plurality of DLLs are utilized in parallel to reduce the time required for reference path re-calibration during operation of the invention.

Note that FIG. 7 specifically shows four DLLs operating in parallel and as a result the calibration time for the reference path is reduced by a factor of four. According to alternate embodiments of the invention, different numbers of multiple DLLs may be included within the spirit of the embodiment of FIG. 7. For instance eight DLLs may be used in parallel to reduce the calibration time for the reference path by a factor of eight. In a similar manner any number of DLLs may be chosen for this implementation according to the needs of the system. In the extreme, for a delay sweep of 256 delay increments, one could implement a circuit with 256 DLLs in parallel. Note that as additional DLLs are utilized in parallel, calibration time diminishes accordingly, however additional circuitry is included using more silicon real estate. As such, a designer may make an appropriate trade-off between calibration time and silicon consumption for any given system implementation.

Figure 8:
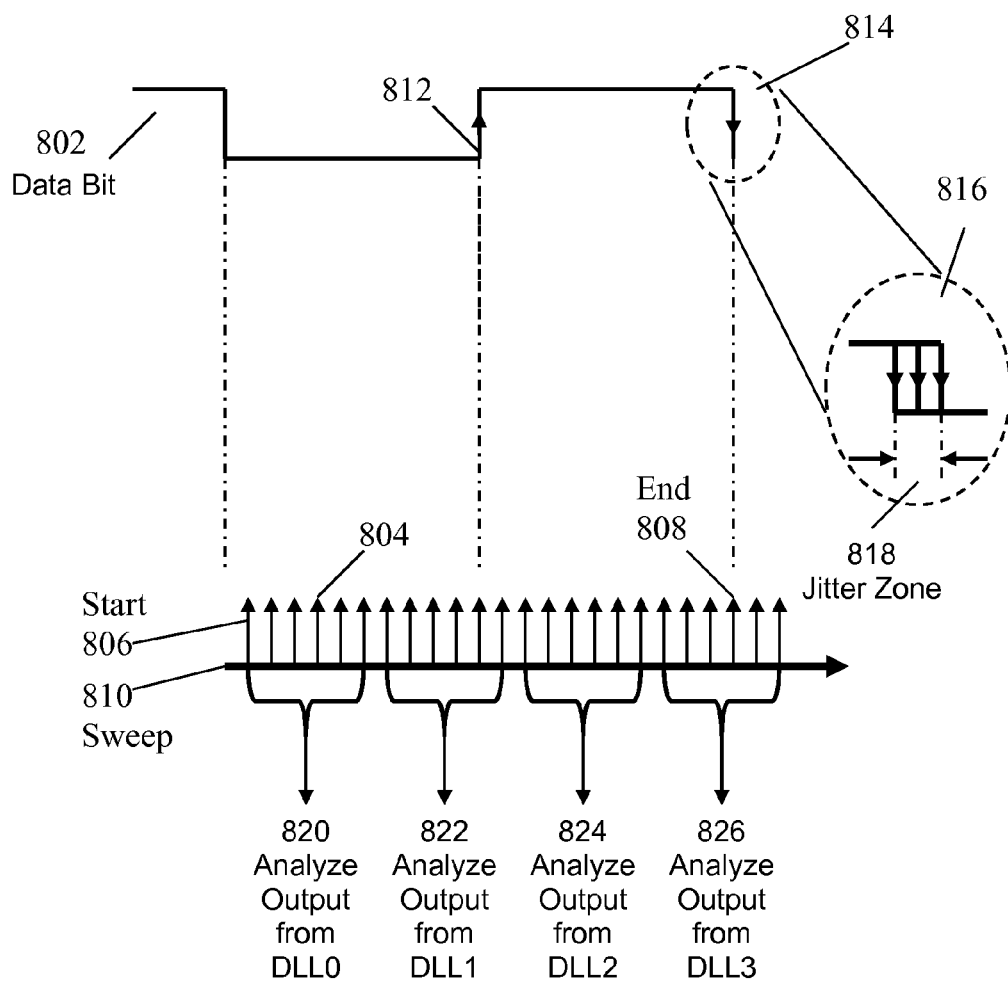
FIG. 8 shows an exemplary timing diagram for the embodiment of FIG. 7 including provision for jitter detection and avoidance.

A calibration sweep for the multiple DLL implementation of FIG. 7 is shown in FIG. 8. Here data bit 802 is being sampled by strobe 804 which is delayed and swept 810 from start delay increment 806 through an end delay at increment 808. Transitions 812 and 814 of data bit 802 are possible determination points for ending a sweep. In this example falling edge 814 has been chosen as the determination condition for ending the sweep. Consistent with the circuit implementation of FIG. 7, sweep 810 is divided into sections 820-826. Delay increments encompassed by section 820 of sweep 810 correspond to DLL0 708 of FIG. 7. Delay increments encompassed by section 822 of sweep 810 correspond to DLL1 710 of FIG. 7. Delay increments encompassed by section 824 of sweep 810 correspond to DLL2 712 of FIG. 7. Delay increments encompassed by section 826 of sweep 810 correspond to DLL3 714 of FIG. 7. Note that since for example, DLL0 is only responsible for analyzing the first 25% of a delay sweep, it is not necessary to include the circuitry for the other 75% 716 of that delay line, which can then be depopulated to save silicon real estate. Conversely, DLL3 is responsible for the last 25% of the delay line, and thus requires all of the preceding 75%. DLL3 is therefore not depopulated.

When a strobe samples a data bit at either transition of the data bit, any jitter 816 occurring on either the strobe or the data bit may cause an incorrect determination of the condition for ending the sweep. For instance in the diagram of FIG. 8, if there is jitter on rising edge 812 it could be possible for a falling edge transition to be detected as part of that jitter whereas the true falling edge which ends the sweep is falling edge 814. As such, to avoid making an incorrect determination when a jitter zone 818 is encountered, the invention includes the requirement for any detected transitions to be separated from other detected transitions by at least a jitter threshold margin of delay. Such a jitter threshold margin may be set to any number of DLL delay increments according to the requirements of a specific application.

Thus, a circuit and operating method for a continuous adaptive training function for dynamic timing calibration of data interfaces has been described.

It should be appreciated by a person skilled in the art that methods, processes and systems described herein can be implemented in software, hardware, firmware, or any combination thereof. The implementation may include the use of a computer system having a processor and a memory under the control of the processor, the memory storing instructions adapted to enable the processor to carry out operations as described hereinabove. The implementation may be realized, in a concrete manner, as a computer program product that includes a non-transient and tangible computer readable medium holding instructions adapted to enable a computer system to perform the operations as described above.

The invention claimed is:

1. A data interface circuit, comprising:
a calibration controller circuit;
two parallel data capture paths that capture a common data bit value, where each path includes a programmable DLL controlled by the calibration controller, said two data capture paths comprising a mission path that performs data capture for a functional circuit, and a reference path that performs data capture solely for calibration purposes;
wherein one programmable DLL delays the common data bit for the mission path and one DLL delays the common data bit for the reference path; and
wherein the data interface circuit is capable of performing continuous timing calibration and is operated by a method comprising:
performing an initial calibration operation for both reference and mission paths to establish optimal delay settings, and determining a delta value between the optimal delay settings for the reference and mission paths;
operating the functional circuit including operation of the mission path;
from time to time and without interfering with operation of the functional circuit or the mission path, performing an additional calibration of the reference data path to determine a new optimal delay setting for the reference path; and
if the new optimal delay setting for the reference data path differs from a previous delay setting by an amount greater than a change threshold value, setting the delay setting for the mission path to be equal to the new optimal delay setting for the reference path adjusted by the delta value.

2. The circuit of claim 1, wherein operation of the circuit further comprises:
for the initial calibration of the mission path, performing a sweep of the mission path DLL from a start point to an end point, wherein the end point of the sweep is determined by detecting a transition on the captured data bit value, wherein the captured data bit value comprises the common data bit value.

3. The circuit of claim 2, wherein operation of the circuit further comprises:
choosing a calibration timing delay value based on the sweep end point that is different from a delay value corresponding to that of the sweep end point.

4. The circuit of claim 2, wherein to detect a transition on the captured data bit value, the transition must be separated from a previously detected transition by at least a number of delay line increments equal to a predetermined jitter threshold value.

5. The circuit of claim 1, wherein operation of the circuit further comprises:
for the initial and subsequent calibrations of the reference path, performing a sweep of the reference path DLL from a start point to an end point, wherein the sweep end point is determined by detecting a transition on the captured data bit value.

6. The circuit of claim 5, wherein operation of the circuit further comprises:
choosing a calibration timing delay value based on the sweep end point that is different from a delay value corresponding to that of the sweep end point.

7. The circuit of claim 5, wherein to detect a transition on the captured data bit value, the transition must be separated from a previously detected transition by at least a number of delay line increments equal to a predetermined jitter threshold value.

8. A data interface circuit, comprising:
a calibration controller circuit;
two parallel data capture paths that capture a common data bit value, where each path includes a programmable DLL controlled by the calibration controller, said two data capture paths comprising a mission path that performs data capture for a functional circuit, and a reference path that performs data capture solely for calibration purposes;
wherein one programmable DLL delays a capture strobe for the mission path and one DLL delays a capture strobe for the reference path; and
wherein the data interface circuit is capable of performing continuous timing calibration and is operated by a method comprising:
performing an initial calibration operation for both reference and mission paths to establish optimal delay settings, and determining a delta value between the optimal delay settings for the reference and mission paths;
operating the functional circuit including operation of the mission path;
from time to time and without interfering with operation of the functional circuit or the mission path, performing an additional calibration of the reference path to determine a new optimal delay setting for the reference path; and if the new optimal delay setting for the reference data path differs from a previous delay setting by an amount greater than a change threshold value, setting the delay setting for the mission path to be equal to the new optimal delay setting for the reference path adjusted by the delta value.

9. The circuit of claim 8, wherein operation of the circuit further comprises:

for the initial calibration of the mission path, performing a sweep of the mission path DLL from a start point to an end point, wherein the end point of the sweep is determined by detecting a transition on the captured data bit value.

10. The circuit of claim 9, wherein operation of the circuit further comprises:

choosing a calibration timing delay value based on the sweep end point that is different from a delay value corresponding to that of the sweep end point.

11. The circuit of claim 9, wherein to detect a transition on the captured data bit value, the transition must be separated from a previously detected transition by at least a number of delay line increments equal to a predetermined jitter threshold value.

12. The circuit of claim 8, wherein operation of the circuit further comprises:

for the initial and subsequent calibrations of the reference path, performing a sweep of the reference path DLL from a start point to an end point, wherein the sweep end point is determined by detecting a transition on the captured data bit value.

13. The circuit of claim 12, wherein operation of the circuit further comprises:

choosing a calibration timing delay value based on the sweep end point that is different from a delay value corresponding to that of the sweep end point.

14. The circuit of claim 12, wherein to detect a transition on the captured data bit value, the transition must be separated from a previously detected transition by at least a number of delay line increments equal to a predetermined jitter threshold value.

15. A circuit for implementing a continuous timing calibration function for a data interface, comprising:

a calibration controller circuit;

two parallel data capture circuits that capture a common data bit value, where each data capture circuit includes at least one programmable DLL controlled by the calibration controller, said two parallel data capture circuits comprising a mission path that performs data capture for a functional circuit, and a reference path that performs data capture solely for calibration purposes; and wherein an initial calibration is performed for both reference and mission paths to establish optimal initial delay settings, and a delta value between the optimal delay settings of the reference and mission paths is determined;

wherein the functional circuit operates including operation of the mission path;

wherein from time to time during operation of the functional circuit, and without interfering with operation of the functional circuit or the mission path, an additional calibration operation is performed for the reference path to determine a new optimal delay setting; and wherein if a new optimal delay setting for the reference data path differs from a previous optimal delay setting by an amount greater than a change threshold value, the delay setting for the mission path is set to a value that is equal to the new optimal delay setting for the reference path adjusted by the delta value.

16. The circuit of claim 15, wherein the common data bit is programmably delayed for each of both the mission and reference paths, and data bit delays for both mission and reference paths are controlled by the calibration controller.

17. The circuit of claim 15, wherein a capture strobe is programmably delayed for each of both the mission and reference paths, and delays for both mission and reference paths are controlled by the calibration controller.

18. The circuit of claim 15, wherein during a calibration operation of either the mission or reference path, a sweep of the DLL for that path from a start point to an end point is performed, and wherein the sweep end point is determined by detecting a transition on the captured data bit value.

19. The circuit of claim 18, wherein a calibration timing delay value is chosen based on the sweep end point that is different from a delay value corresponding to that of the end point.

20. The circuit of claim 18, wherein to detect a transition on the captured data bit value, the transition must be separated from a previously detected transition by at least a number of delay line increments equal to a predetermined jitter threshold value.

* * * * *